(12) United States Patent
Banerjee et al.

(10) Patent No.: US 10,777,956 B1
(45) Date of Patent: Sep. 15, 2020

(54) SYSTEM FOR SUPPLYING ELECTRIC POWER TO A PLURALITY OF LOAD CIRCUIT BOARDS INCLUDING A CIRCUIT FOR OSCILLATION MITIGATION

(71) Applicant: TAS Energy, Inc., Houston, TX (US)

(72) Inventors: Abhishek Banerjee, Houston, TX (US); William J. Bongers, Houston, TX (US); Randall Erskine, Houston, TX (US)

(73) Assignee: TAS ENERGY, INC., Houston, TX (US)

( * ) Notice: Subject to any disclaimer, the term of this patent is extended or adjusted under 35 U.S.C. 154(b) by 0 days.

(21) Appl. No.: 16/565,037

(22) Filed: Sep. 9, 2019

(51) Int. Cl.
| | |
|---|---|
| H01R 31/06 | (2006.01) |
| H05K 1/18 | (2006.01) |
| H01R 31/02 | (2006.01) |
| H01R 12/70 | (2011.01) |
| H05K 1/02 | (2006.01) |
| H02B 1/20 | (2006.01) |
| H05K 7/20 | (2006.01) |

(52) U.S. Cl.
CPC ....... *H01R 31/065* (2013.01); *H01R 12/7088* (2013.01); *H01R 31/02* (2013.01); *H02B 1/20* (2013.01); *H05K 1/0263* (2013.01); *H05K 1/18* (2013.01); *H05K 7/20236* (2013.01); *H05K 2201/1003* (2013.01); *H05K 2201/10015* (2013.01); *H05K 2201/10181* (2013.01); *H05K 2201/10189* (2013.01)

(58) Field of Classification Search
CPC ...... H01R 31/065; H02B 1/20; H05K 1/0263; H05K 1/18
See application file for complete search history.

(56) References Cited

U.S. PATENT DOCUMENTS

| | | | |
|---|---|---|---|
| 7,151,298 B1 * | 12/2006 | Eggert | H01L 23/60 257/355 |
| 7,248,483 B2 * | 7/2007 | West | H02M 7/003 361/756 |
| 2004/0057211 A1 * | 3/2004 | Kondo | G06F 1/20 361/696 |
| 2007/0184721 A1 * | 8/2007 | Ewing | H01R 25/006 439/620.26 |

* cited by examiner

*Primary Examiner* — Binh B Tran
*Assistant Examiner* — Hiram E Gonzalez
(74) *Attorney, Agent, or Firm* — Jonathan Pierce; Pierre Campanac; Porter Hedges LLP

(57) ABSTRACT

Oscillation mitigation circuits are implemented in a system for supplying electric power to load circuit boards, for example, load circuit boards entirely immersed into a bath of dielectric heat transfer fluid. The oscillation mitigation circuits can be used to protect the load circuit boards, including the connectors mounted on these load circuit boards, from an anomalous behavior of the electric power. The oscillation mitigation circuits are coupled between wire bundles forming a portion of the electric power supply and the connectors mounted on the load circuit boards.

21 Claims, 3 Drawing Sheets

US 10,777,956 B1

SYSTEM FOR SUPPLYING ELECTRIC POWER TO A PLURALITY OF LOAD CIRCUIT BOARDS INCLUDING A CIRCUIT FOR OSCILLATION MITIGATION

CROSS-REFERENCE TO RELATED APPLICATIONS

None

BACKGROUND

This disclosure relates generally to systems for supplying electric power to a plurality of load circuit boards, for example, provided in an immersion-cooled information system. This disclosure relates more particularly to circuits that may be used in such systems for mitigating oscillations of the supplied voltage and/or current.

FIG. 1 illustrates a known system for supplying electric power to a plurality of load circuit boards 16. The system comprises a DC voltage converter 10, which may generate high current, low voltage DC power from 3-phases, high voltage electric power. The DC voltage converter 10 comprises a positive terminal, which is coupled to a first busbar 12, and a ground terminal, which is coupled to a second busbar 14. A wire harness 18 connects the first busbar 12 and the second busbar 14 to the plurality of load circuit boards 16. For example, the wire harness may be configured as described in U.S. Pat. No. 10,257,960, the content of which is included herein by reference in its entirety and for any and all purposes.

FIG. 2 illustrates voltage curves 20, 22, and a current curve 24 measured when the known system of FIG. 1 is being used. The voltage curve 20 and the current curve 26 were measured at one of the input connector of one of the plurality of load circuit boards 16. The voltage curve 22 was measured between the DC voltage converter 10 and one of the first busbar 12 and the second busbar 14. The voltage scale is two volts per divisions, and the current scale is fifty amps per division. The graph shows the oscillations of the voltage and current. Without being limited to any theory, the oscillations may be caused by the variation of the electric power consumed by the plurality of load circuit boards 16, as well as by the distance between the plurality of load circuit boards 16 and the DC voltage converter 10. Such oscillations may interfere with or compromise the intended function of load circuit boards 16. Therefore, reducing the oscillations is desirable.

Thus, there is a continuing need in the art for systems for supplying electric power to a plurality of load circuit boards. Preferably, such systems include a circuit for mitigating oscillations of the supplied voltage and/or current.

BRIEF SUMMARY OF THE DISCLOSURE

This disclosure describes a system used for supplying electric power to a plurality of load circuit boards.

The system may comprise a busbar. The busbar may be coupled to a positive terminal of a DC voltage converter.

The system may comprise an inductor. The inductor may comprise a plurality of inductors coupled in series. The inductor may be coupled between the busbar and a node.

The system may comprise a plurality of wires forming a wire harness. The plurality of wires may be coupled in parallel between the busbar and the inductor.

The system may comprise a capacitor. The capacitor may comprise a plurality of capacitors coupled in parallel. The capacitor may be coupled between the node and a ground reference coupled to a ground terminal of the DC voltage converter.

The system may comprise a first plurality of connectors. Each of the first plurality of connectors may be mounted on a corresponding one of the plurality of load circuit boards.

The system may comprise a second plurality of connectors. Each of the second plurality of connectors may be coupled in parallel between the node and a corresponding one of the first plurality of connectors. Each the second plurality of connectors may further be coupled in parallel between the ground reference and the corresponding one of the first plurality of connectors.

The system may comprise a plurality of fuses coupled in parallel between the node and a corresponding one of the second plurality of connectors.

The system may comprise a fuse coupled between the node and the capacitor.

The system may further comprise an oscillation mitigation board. Each of the plurality of wires forming the wire harness may be terminated by a connector that engages a corresponding connector mounted on the oscillation mitigation board. The inductor and/or the capacitor may be mounted on the oscillation mitigation board. The fuses may also be mounted on the oscillation mitigation board. The ground reference may include a trace printed on the oscillation mitigation board.

BRIEF DESCRIPTION OF THE DRAWINGS

For a more detailed description of the embodiments of the disclosure, reference will now be made to the accompanying drawings, wherein.

DETAILED DESCRIPTION

The disclosure describes a circuit for mitigating electric power oscillations. The circuit may protect load circuit boards, including the connectors mounted on these load circuit boards, from an anomalous behavior of the electric power. In an exemplary application, the load circuit boards may be entirely immersed into a bath of dielectric, heat transfer fluid, such as used in a blockchain mining operation. The oscillation mitigation circuit is coupled between wire bundles forming a portion of the electric power supply and the connectors mounted on the load circuit boards.

Figure 3:
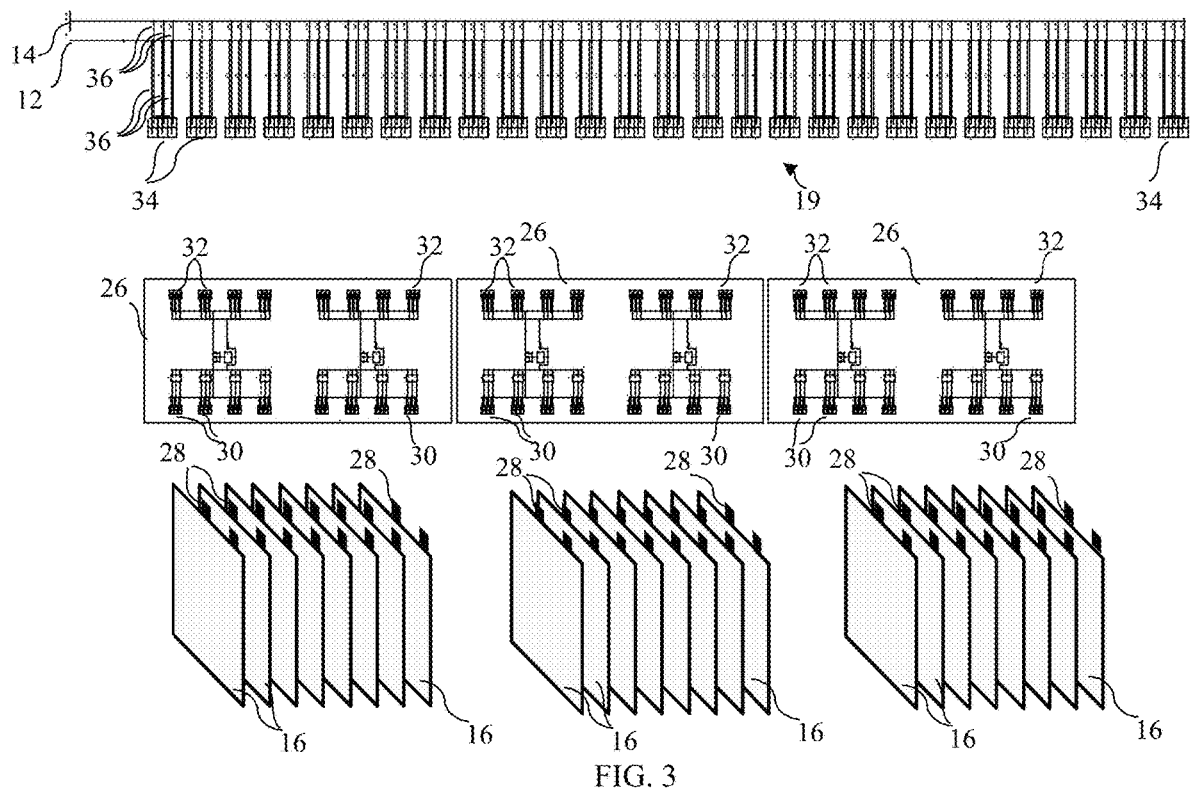
FIG. 3 is a schematic of a system for supplying electric power to a plurality of load circuit boards including a circuit for oscillation mitigation.
Figure 4:
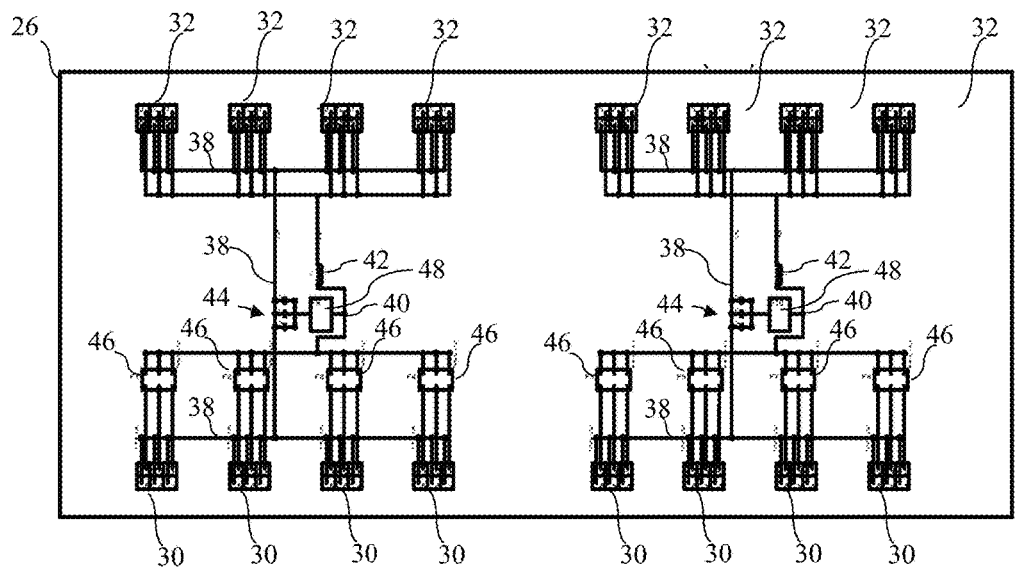
FIG. 4 is a schematic of the circuit for oscillation mitigation shown in FIG. 3.

Referring to FIGS. 3 and 4, a system for supplying electric power to load circuit boards 16 may comprise oscillation mitigation boards 26. Each of the oscillation mitigation boards 26 comprises a circuit for oscillation mitigation. The circuit for oscillation mitigation comprises an inductor 42, a capacitor 44, and optionally fuses 46 and 48, which may be mounted on the oscillation mitigation boards 26. While the embodiment illustrated in FIGS. 3 and 4 shows the circuit for oscillation mitigation mounted on the oscillation mitigation boards 26, the oscillation mitigation boards 26 may be omitted in other embodiments.

The inductor 42 may comprise a plurality of inductors coupled in series, or a combination of shunts and inductors coupled in series. Thus, the oscillation mitigation board 26 may easily accommodate different inductance values.

The capacitor 44 may comprise a plurality of capacitors coupled in parallel. Thus, the oscillation mitigation board 26 may easily accommodate different capacitance values.

The circuit for oscillation mitigation comprises node 40 that connects a first circuit element, a second circuit element, and a plurality of third circuit elements. The first circuit element comprises the inductor 42 coupled to a positive terminal of a DC voltage supply. The second circuit element comprises the capacitor 44 and, optionally, fuse 48 coupled to a ground terminal of the DC voltage supply. Each of the plurality of third circuit elements comprises a connector 30 and, optionally, fuse 46. Each of the plurality of third circuit elements is coupled to a load circuit board 16. All of the plurality of third circuit elements may be identical or similar.

Figure 1:
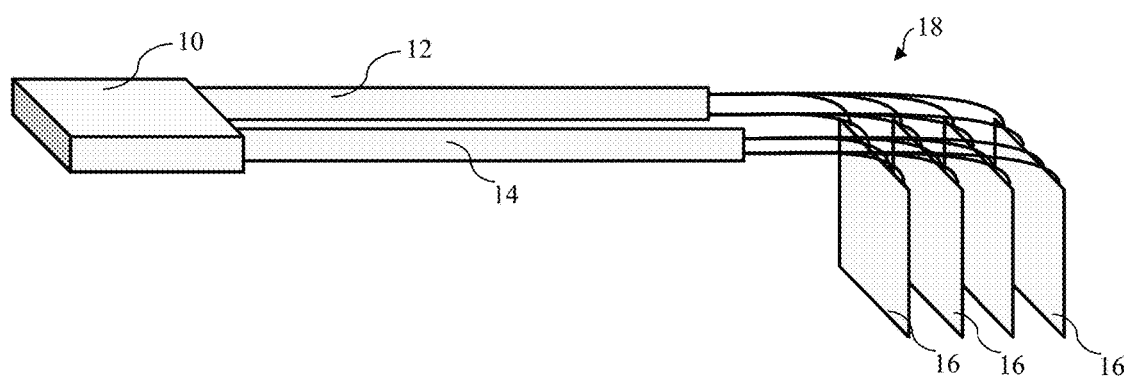
FIG. 1 is a schematic of a known system for supplying electric power to a plurality of load circuit boards.

For supplying DC voltage to the circuit for oscillation mitigation, the system may comprise one or more DC voltage converter(s) 10 (shown in FIG. 1). The one or more DC voltage converter(s) 10 may generate high current, low voltage DC power. The DC voltage converter 10 comprises a positive terminal and a ground terminal (shown in FIG. 1). A first busbar 12 is coupled to the positive terminal, and a second busbar 14 is coupled to the ground terminal. A wire harness 18 (shown in FIG. 1) may couple the circuit for oscillation mitigation to the first busbar 12 and/or the second busbar 14. An alternative design of the DC voltage converter 10, the first busbar 12, the second busbar 14, and the wire harness 18 that a person of ordinary skill in the art would recognize could replace the design illustrated in the preferred embodiment of FIGS. 3 and 4, may be used in other embodiments.

For coupling the first busbar 12 and/or the second busbar 14 to the circuit for oscillation mitigation, the wire harness 18 may comprise wire bundles 19, one of which is illustrated schematically in FIG. 3. The wire bundle 19 is formed from wires 36 that are coupled in parallel to the first busbar 12 and the second busbar 14. The wires are terminated by connectors 34. The connectors 34 can be engaged to corresponding connectors 32, which may be mounted on the oscillation mitigation boards 26. For example, the connectors 34 may be male, pigtail, Molex connectors, or other types of connectors known to a person of ordinary skill in the art. Similarly, the connectors 32 may be female, PCB mounted, Molex connectors, or other types of connectors known to a person of ordinary skill in the art. While the embodiment illustrated in FIGS. 3 and 4 shows that each connector 34 is coupled to the first busbar 12 by three wires 36 and to the second busbar 14 by three other wires 36, the number and bundling of wires may be varied. Also, while the embodiment illustrated in FIGS. 3 and 4 shows that each oscillation mitigation board 26 includes exactly four connectors 34, the number of connectors per board may also be varied.

For coupling the load circuit boards 16 to node 40 of the circuit for mitigating oscillations, the system may comprise the connectors 30. The connectors 30 may be coupled to the oscillation mitigation board 26, where the node 40 is located, using wires. Each connector 30 may be engaged with a corresponding connector 28 mounted on one of the load circuit boards 16. For example, the connectors 30 may be male, pigtail, Molex connectors, or other types of connectors known to a person of ordinary skill in the art. Similarly, the connectors 28 may be female, PCB mounted, Molex connectors, or other types of connectors known to a person of ordinary skill in the art. While the embodiment illustrated in FIGS. 3 and 4 shows that each connector 30 is coupled to node 40 by three wires, the number of wires may be varied. Also, while the embodiment illustrated in FIGS. 3 and 4 shows that each oscillation mitigation board 26 is coupled to exactly four connectors 30, the number of connectors per board may also be varied.

For grounding, a ground reference may be coupled to a ground terminal of the DC voltage converter 10 via the second busbar 14 and the wire bundle 19. The ground reference may include a trace 38 printed on the oscillation mitigation boards 26. Each capacitor 44 may be coupled between the trace 38 and node 40, optionally through one of the fuses 48. The trace 38 is also coupled to the load circuit boards 16 by a connector 30 engaged with a connector 28 mounted on one of the oscillation mitigation boards 26. An alternative design of the wire bundle 10, the trace 38, and the connectors 30 that a person of ordinary skill in the art would recognize could replace the design illustrated in the preferred embodiment of FIGS. 3 and 4, may be used in other embodiments.

Figure 2:
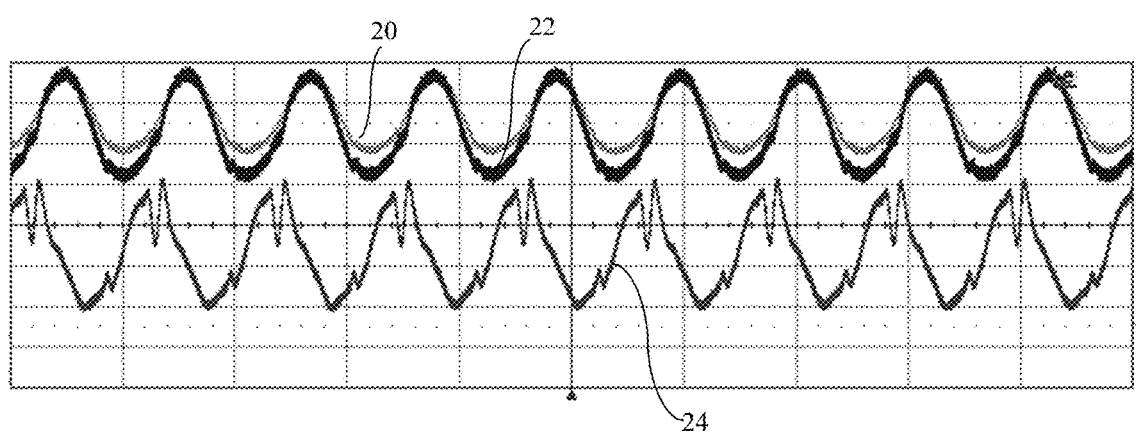
FIG. 2 is a graph showing voltage and current curves for the system in FIG. 1 measured in the absence of a circuit for oscillation mitigation.

While the embodiment illustrated in FIGS. 3 and 4 shows one wire bundle 19 connected the oscillation mitigation boards 26 to the connectors 28 on each of the load circuit boards 16, the wire harness 18 (shown in FIG. 2) may comprise additional wire bundles (e.g., similar to wire bundle 19). Further, each of load circuit boards 16 may comprise additional connectors mounted thereon (e.g., similar to the connectors 28). Still further, additional circuits for mitigating oscillations of the electric power, similar to the oscillation mitigation circuit described herein, may be coupled between the additional wire bundles and the additional connectors mounted on the load circuit boards 16.

Suitable values of the inductance of the inductor 42 and the capacitance of the capacitor 44 can be selected using routine experimentation or modeling so as to reduce the amplitude of the voltage or current oscillations measured at one or more of the input connector of one or more of the plurality of load circuit boards 16, and/or the amplitude of the voltage or current oscillations measured between the DC voltage converter and one or more busbar. Without being limited to any theory, the inductance of the inductor 42 and the capacitance of the capacitor 44 may cancel resonances that would otherwise be caused by parasitic capacitance of the busbars, as well as self- and cross-inductance of the busbars.

If implemented, suitable values of the rated current of the fuses 46 or the fuse 48 can also be selected based on the power requirements of the load circuit boards 16 so as to protect the load circuit boards 16 from damaging voltage or current surges.

Figure 5:
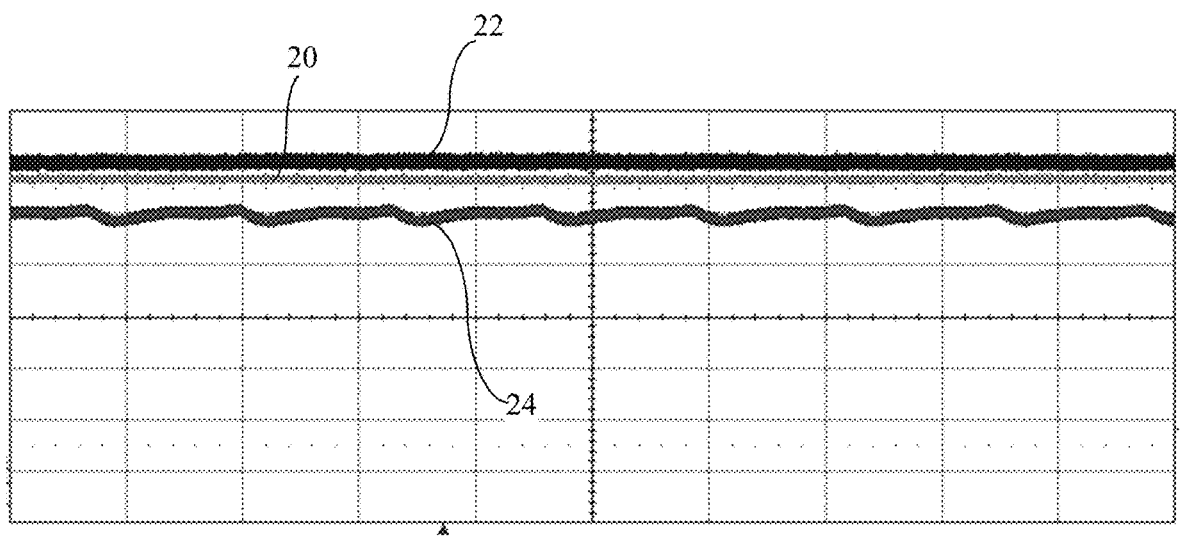
FIG. 5 is a graph showing voltage and current curves for the circuit of FIGS. 3 and 4 measured in the presence of a circuit for oscillation mitigation.

Turning to FIG. 5, illustrated are voltage curves 20, 22 and a current curve 24 measured when the circuit for oscillation mitigation illustrated in FIGS. 3 and 4 is being used. In FIG. 5, the voltage scale is two volts per divisions, which is the same as FIG. 2, and the current scale is twenty amps per division, which is a magnified scale compared to FIG. 2. FIG. 5 illustrates that the circuit for oscillation mitigation reduces the oscillations of the voltage by at least a factor 10 (i.e., from over 5 volts peak-to-peak to less than 0.5 volt peak-to-peak). FIG. 5 also illustrates that the circuit for oscillation mitigation reduces the oscillations of current by at least a factor 10 (i.e., from over 30 amps peak-to-peak to less than 0.3 amp peak-to-peak).

Specific embodiments of the invention are shown by way of example in the drawings and description. It should be understood that the drawings and detailed description thereto are not intended to limit the claims to the particular form disclosed, but on the contrary, the intention is to cover all modifications, equivalents, and alternatives falling within the scope of the claims.

What is claimed is:

1. A system for supplying electric power to a plurality of load circuit boards, the system comprising:
    a busbar electrically coupled to a positive terminal of a DC voltage converter;
    a circuit for oscillation mitigation;
    wherein the circuit for oscillation mitigation includes an inductor coil electrically coupled between the busbar and a node;
    wherein the circuit for oscillation mitigation includes a capacitor electrically coupled between the node and a ground reference that is electrically coupled to a ground terminal of the DC voltage converter;
    a first plurality of connectors each mounted on a corresponding one of the plurality of load circuit boards; and
    a second plurality of connectors, each of the second plurality of connectors being electrically coupled in parallel between the node and a corresponding one of the first plurality of connectors.

2. The system of claim 1 wherein each the second plurality of connectors is further electrically coupled in parallel between the ground reference and the corresponding one of the first plurality of connectors.

3. The system of claim 2 further comprising an oscillation mitigation board, wherein the inductor coil and the capacitor are mounted on the oscillation mitigation board, and wherein the ground reference includes a trace printed on the oscillation mitigation board.

4. The system of claim 1 wherein a plurality of wires forming a wire harness are electrically coupled in parallel between the busbar and the inductor coil.

5. The system of claim 4 further comprising an oscillation mitigation board, wherein the inductor coil and the capacitor are mounted on the oscillation mitigation board, and wherein each of the plurality of wires is terminated by a connector that engages a corresponding connector mounted on the oscillation mitigation board.

6. The system of claim 1 further comprising a plurality of fuses electrically coupled in parallel between the node and a corresponding one of the second plurality of connectors.

7. The system of claim 6 further comprising an oscillation mitigation board, wherein each of the inductor coil, the capacitor, and the plurality of fuses is mounted on the oscillation mitigation board.

8. The system of claim 1 further comprising a fuse electrically coupled between the node and the capacitor.

9. The system of claim 8 further comprising an oscillation mitigation board, wherein the inductor coil, the capacitor, and the fuse are mounted on the oscillation mitigation board.

10. The system of claim 1 further comprising an oscillation mitigation board, wherein the inductor coil and the capacitor are mounted on the oscillation mitigation board.

11. The system of claim 1 wherein the inductor coil comprises a plurality of inductor coils electrically coupled in series.

12. The system of claim 1 wherein the capacitor comprises a plurality of capacitors coupled in parallel.

13. The system of claim 1 further comprising:
    a plurality of fuses electrically coupled in parallel between the node and a corresponding one of the second plurality of connectors; and
    a fuse electrically coupled between the node and the capacitor.

14. A system for supplying electric power to a plurality of load circuit boards, the system comprising:
    a busbar electrically coupled to a positive terminal of a DC voltage converter;
    means for electrically coupling the busbar to a circuit for oscillation mitigation;
    wherein the circuit for oscillation mitigation includes an inductor coil, wherein the inductor coil is electrically coupled between the means for electrically coupling the busbar to the circuit for oscillation mitigation and a node;
    wherein the circuit for oscillation mitigation includes a capacitor, wherein the capacitor is electrically coupled between the node and a ground reference that is electrically coupled to a ground terminal of the DC voltage converter; and
    means for electrically coupling each of the plurality of load circuit boards to the node.

15. The system of claim 14 wherein the circuit for oscillation mitigation further includes a plurality of fuses electrically coupled in parallel between the node and the means for electrically coupling each of the plurality of load circuit boards to the node.

16. The system of claim 14 wherein the circuit for oscillation mitigation further includes a fuse electrically coupled between the node and the capacitor.

17. The system of claim 14 wherein the circuit for oscillation mitigation further includes:
    a plurality of fuses electrically coupled in parallel between the node and a corresponding one of the second plurality of connectors; and
    a fuse electrically coupled between the node and the capacitor.

18. A system for supplying electric power to a plurality of load circuit boards, the system comprising:
    means for supplying DC voltage to a circuit for oscillation mitigation;
    wherein the circuit for oscillation mitigation includes an inductor coil, wherein the inductor coil is electrically coupled between the means for supplying DC voltage to the circuit for oscillation mitigation and a node;
    wherein the circuit for oscillation mitigation includes a capacitor, wherein the capacitor is electrically coupled between the node and means for grounding; and
    means for electrically coupling each of the plurality of load circuit boards to the node.

19. The system of claim 18 wherein the circuit for oscillation mitigation further includes a plurality of fuses electrically coupled in parallel between the node and the means for electrically coupling each of the plurality of load circuit boards to the node.

20. The system of claim 18 wherein the circuit for oscillation mitigation further includes a fuse electrically coupled between the node and the capacitor.

21. The system of claim 18 wherein the circuit for oscillation mitigation further includes:
    a plurality of fuses electrically coupled in parallel between the node and a corresponding one of the second plurality of connectors; and a fuse electrically coupled between the node and the capacitor.

* * * * *